US010734298B2

(12) United States Patent
Yeom et al.

(10) Patent No.: US 10,734,298 B2
(45) Date of Patent: Aug. 4, 2020

(54) METHODS OF REINFORCING INTEGRATED CIRCUITRY OF SEMICONDUCTOR DEVICES AND RELATED SEMICONDUCTOR DEVICES AND PACKAGES

(71) Applicant: Microchip Technology Incorporated, Chandler, AZ (US)

(72) Inventors: Hyunsoo Yeom, Chandler, AZ (US); Ajay Kumar, Phoenix, AZ (US); John House, Mesa, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 16/121,313

(22) Filed: Sep. 4, 2018

(65) Prior Publication Data

US 2019/0393110 A1 Dec. 26, 2019

Related U.S. Application Data

(60) Provisional application No. 62/688,950, filed on Jun. 22, 2018.

(51) Int. Cl.
*H01L 23/16* (2006.01)
*H01L 21/48* (2006.01)
*H01L 21/56* (2006.01)
*H01L 23/31* (2006.01)
*H03K 4/00* (2006.01)

(52) U.S. Cl.
CPC .......... *H01L 23/16* (2013.01); *H01L 21/4871* (2013.01); *H01L 21/56* (2013.01); *H01L 23/3107* (2013.01); *H03K 4/00* (2013.01)

(58) Field of Classification Search
CPC ... H01L 23/16; H01L 23/5228; H01L 23/485; H03K 3/027; H03K 3/03
USPC ............. 331/18, 143, 111, 68; 257/758, 531
See application file for complete search history.

(56) References Cited

U.S. PATENT DOCUMENTS

| | | |
|---|---|---|
| 6,815,234 B2 | 11/2004 | Wellhausen et al. |
| 7,543,253 B2 | 6/2009 | Marinca et al. |
| 9,300,245 B2 | 3/2016 | Maeda et al. |
| 9,502,360 B2 | 11/2016 | Lin et al. |
| 2005/0006771 A1 | 1/2005 | Akiyama |
| 2006/0228879 A1 | 10/2006 | Beach et al. |

(Continued)

OTHER PUBLICATIONS

International Search Report for International Application No. PCT/US2019/034040, dated Aug. 29, 2019, 5 pages.

(Continued)

*Primary Examiner* — Joseph Chang
(74) *Attorney, Agent, or Firm* — TraskBritt (57) ABSTRACT

Methods of making a semiconductor device packages may involve placing a metal material at least partially around a region of integrated circuitry embedded within an active surface of a semiconductor die, the metal material located on the active surface. At least a portion of the metal material may be left electrically disconnected from the region of integrated circuitry. The semiconductor die and the metal material may be encapsulated in an encapsulant material, the encapsulant material extending to a height above the active surface higher than a maximum height of the metal material above the active surface.

23 Claims, 8 Drawing Sheets

(56) References Cited

U.S. PATENT DOCUMENTS

| | | |
|---|---|---|
| 2009/0278256 A1* | 11/2009 | Fan .................. H01L 23/13 |
| | | 257/738 |
| 2011/0241164 A1 | 10/2011 | Makamura |
| 2011/0291299 A1 | 12/2011 | Chumakov et al. |
| 2014/0374914 A1 | 12/2014 | Kim et al. |
| 2015/0303143 A1 | 10/2015 | Miyazaki |
| 2016/0204741 A1 | 7/2016 | Maeda et al. |
| 2017/0331429 A1 | 11/2017 | Motz |

OTHER PUBLICATIONS

International Written Opinion for International Application No. PCT/US2019/034040, dated Aug. 29, 2019, 8 pages.

* cited by examiner

METHODS OF REINFORCING INTEGRATED CIRCUITRY OF SEMICONDUCTOR DEVICES AND RELATED SEMICONDUCTOR DEVICES AND PACKAGES

CROSS-REFERENCE TO RELATED APPLICATION

This application claims the benefit under 35 U.S.C. § 119(e) of U.S. Provisional Patent Application Ser. No. 62/688,950, filed Jun. 22, 2018, the disclosure of which is hereby incorporated herein in its entirety by this reference.

FIELD

This disclosure relates generally to semiconductor devices and to methods of packaging semiconductor devices. More specifically, disclosed embodiments relate to methods of packaging semiconductor devices that may better structurally reinforce the integrated circuitry of such devices, better maintain targeted performance characteristics of the integrated circuitry, increase yield, and better match actual performance of the semiconductor devices to targeted performance.

BACKGROUND

Relaxation oscillators are useful in a wide variety of applications requiring a non-sinusoidal, repetitive output, such as a square, sawtooth, or triangle wave. For example, relaxation oscillators may be used to provide the clock signal for timers, counters, and data communication protocols.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular semiconductor device, semiconductor device package, system incorporating such semiconductor devices and/or semiconductor device packages, or component thereof, but are merely idealized representations employed to describe illustrative embodiments. Thus, the drawings are not necessarily to scale.

Disclosed embodiments relate generally to methods of packaging semiconductor devices that may better reinforce the integrated circuitry, better maintain targeted characteristics of the integrated circuitry, increase yield, and better match actual performance of the semiconductor devices to targeted performance. More specifically, disclosed are embodiments of semiconductor devices and semiconductor device packages that may include mechanical reinforcement.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

As used herein, the term "integrated circuitry" means and includes both active and passive circuitry. By way of example only, passive circuitry includes resistors and capacitors. By way of further example only, active circuitry includes field-effect transistors, operational amplifiers, and voltage amplifiers.

Figure 1:
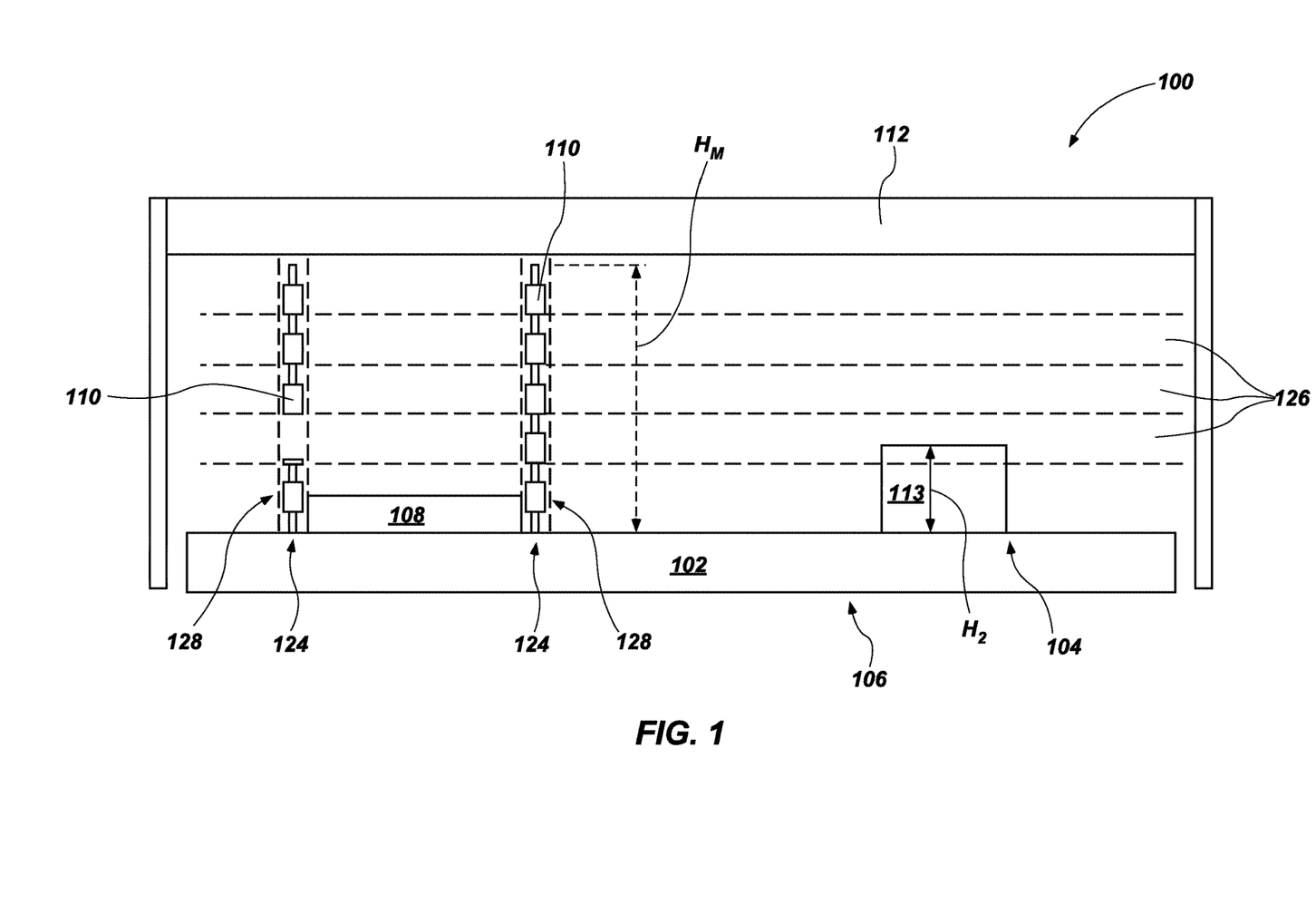
FIG. 1 is a cross-sectional side view of a semiconductor device package.

FIG. 1 is a cross-sectional side view of a semiconductor device package 100. The semiconductor device package 100 may include a semiconductor die 102 having an active surface 104 and an inactive surface 106 located on a side of the semiconductor die 102 opposite the active surface 104. The active surface 104 may include a plurality of regions 108 of integrated circuitry embedded within or formed on the semiconductor material of the semiconductor die 102 at the active surface 104. The integrated circuitry of the active surface 104 of the semiconductor die 102 may be configured as, by way of non-limiting example, a relaxation oscillator. More specifically, one or more of the regions 108 of integrated circuitry may include a resistor or bank of resistors or a capacitor or bank of capacitors. As a specific, nonlimiting example, one or more of the regions 108 of integrated circuitry may include a resistor or bank of resistors, and another of the regions 108 of integrated circuitry may include a capacitor or bank of capacitors. Stated another way, at least one region 108 of integrated circuitry may comprise at least a portion of a relaxation oscillator. A single region 108 of integrated circuitry may comprise a relaxation oscillator, or multiple regions 108 of integrated circuitry may, in combination, comprise a relaxation oscillator. In embodiments where one or more of the regions 108 of integrated circuitry are operatively configured and/or connected in such a way as to operate as a relaxation oscillator, the relaxation oscillator of the semiconductor die 102 may lack any crystal to regulate the timing of the relaxation oscillator.

The operational frequency of a relaxation oscillator including resistors and capacitors, and lacking a crystal to regulate the operational frequency, may depend at least partially on the values of resistance and capacitance of the resistors and capacitors. Those values may drift from their original values during processing, handling, and packaging of the semiconductor die 102. For example, changes in temperature may cause different components of the semiconductor device package 100 having different coefficients of thermal expansion to expand and contract at different rates, stressing the components and resulting in strain-induced artifact of the performance of those components of the semiconductor device package 100. Specifically, strain may alter the values of the resistors and capacitors of the relaxation oscillator, producing a frequency response that may differ in unpredictable ways from a target frequency response. As a result, conventional relaxation oscillators utilizing resistors and capacitors to determine frequency may exhibit greater variance in performance when compared to relaxation oscillators utilizing crystals to determine the oscillation frequency.

Relaxation oscillators in accordance with embodiments of this disclosure may better match actual performance to targeted performance, at least partially as a result of mechanical reinforcement of the regions 108 of integrated circuitry. For example, reinforcing material (e.g., metal material 110) may at least partially laterally surround at least one of the regions 108 of integrated circuitry. The metal material 110 may be located on the active surface 104, and may extend from the active surface 104 to a maximum height $H_M$ above the active surface 104, such as, for example, in a direction at least substantially normal to the active surface 104. The maximum height $H_M$ may be at least substantially equal to, or greater than, a second-greatest maximum height $H_2$ of any other structure 113 (e.g., active or passive circuitry, electrical signal routing structures, etc.) supported on the active surface 104. The metal material 110 may extend laterally to entirely laterally surround one or more of the regions 108 of integrated circuitry. The metal material 110 may not extend, for example, directly over the laterally adjacent regions 108 of integrated circuitry, such that lines extending from the relevant region 108 of integrated circuitry perpendicular to the active surface 104 may not intersect with the metal material 110.

An encapsulant material 112 may encapsulate the metal material 110, the semiconductor die 102, and the regions 108 of integrated circuitry of the active surface 104. For example, the encapsulant material 112 may directly contact surfaces of each of the metal material 110, the semiconductor die 102, and the regions 108 of integrated circuitry of the active surface 104. As another example, the encapsulant material 112 may be located over, and be in indirect contact via other materials with, at least one of the metal material 110, the semiconductor die 102, and the regions 108 of integrated circuitry in the active surface 104. The designation "Package" in FIG. 1 is for the sake of convenience only to show the extent of the encapsulant material 112, and does not necessarily indicate the presence of a shroud or other housing over the encapsulant material 112.

The semiconductor device package 100 itself, or one or more of the regions 108 of integrated circuitry, may be configured as a clock module. For example, the semiconductor device package 100, or one or more of the regions 108 of integrated circuitry, may be configured to provide the clock timing to synchronize one or more operations of the semiconductor device package 100 or another system of which the semiconductor device package 100 is a component.

Figure 2:
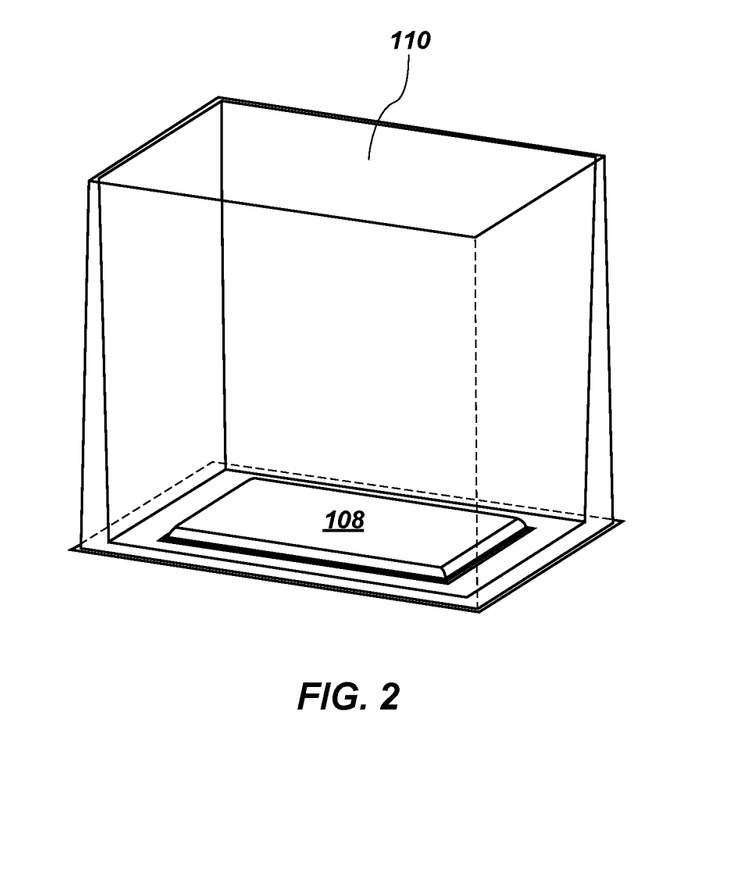
FIG. 2 is a perspective side view of a portion of the semiconductor device package of FIG. 1.

FIG. 2 is a perspective side view of a portion of the semiconductor device package 100 of FIG. 1. The portion shown in FIG. 2 represents a single one of the regions 108 of integrated circuitry and the metal material 110 at least partially surrounding the region 108. As shown in FIG. 2, the metal material 110 may at least substantially form walls extending at least substantially perpendicular to the active surface 104. The walls of the metal material 110 may join in an at least substantially rectangular shape around the region 108. The walls may comprise a laterally continuous, at least substantially contiguous mass of the metal material 110, or may comprise a series of mutually laterally adjacent columns or pillars forming a fence, which may also be characterized as a cage, around one or more components. Further, while columns or pillars may be laterally separated, beams of metal material may be formed between laterally adjacent columns or pillars to provide enhanced shear strength.

Figure 3:
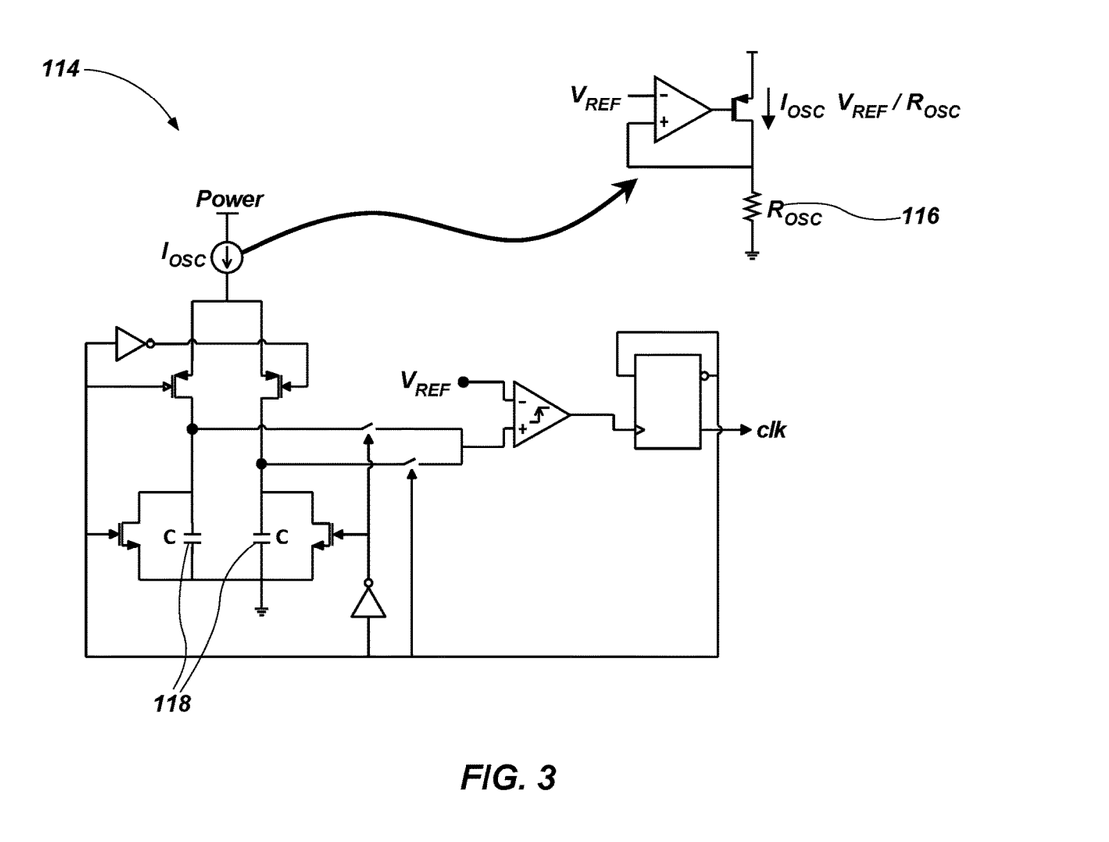
FIG. 3 is a circuit diagram of a relaxation oscillator of the semiconductor device package of FIG. 1.

FIG. 3 is a circuit diagram of a relaxation oscillator 114 of the semiconductor device package of FIG. 1. As shown in FIG. 3, the relaxation oscillator 114 may include one or more resistors 116 and one or more capacitors 118 operatively connected to one another to cause each capacitor 118 to charge and discharge at a targeted oscillation frequency, such that the resultant signal may be non-sinusoidal.

Figure 4:
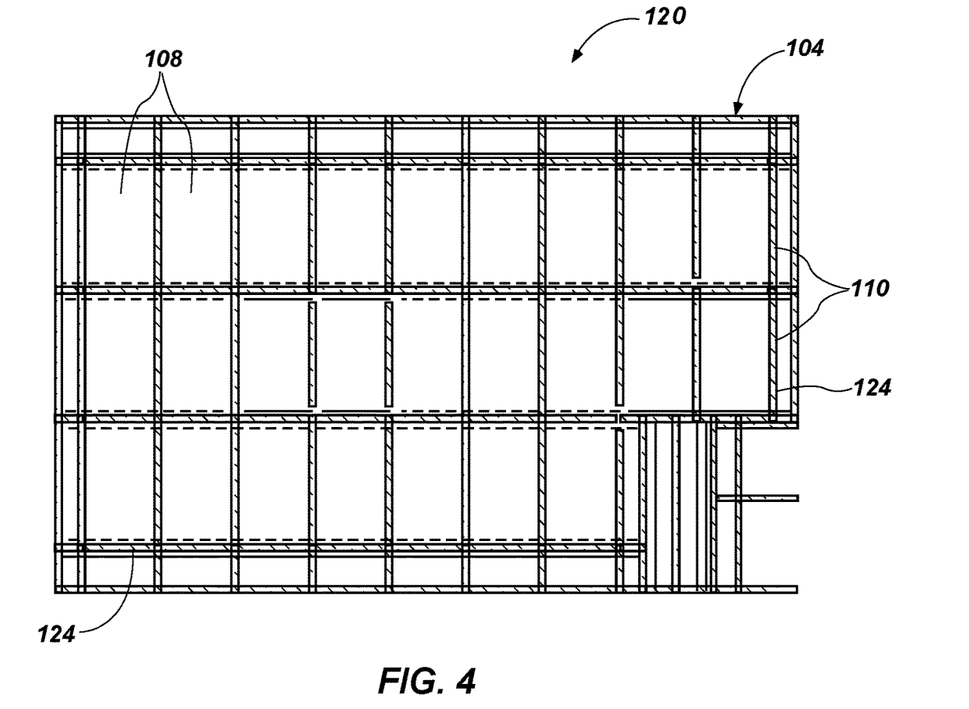
FIG. 4 is a top view of a first portion of an active surface of a semiconductor die of the semiconductor device package of FIG. 1.
Figure 5:
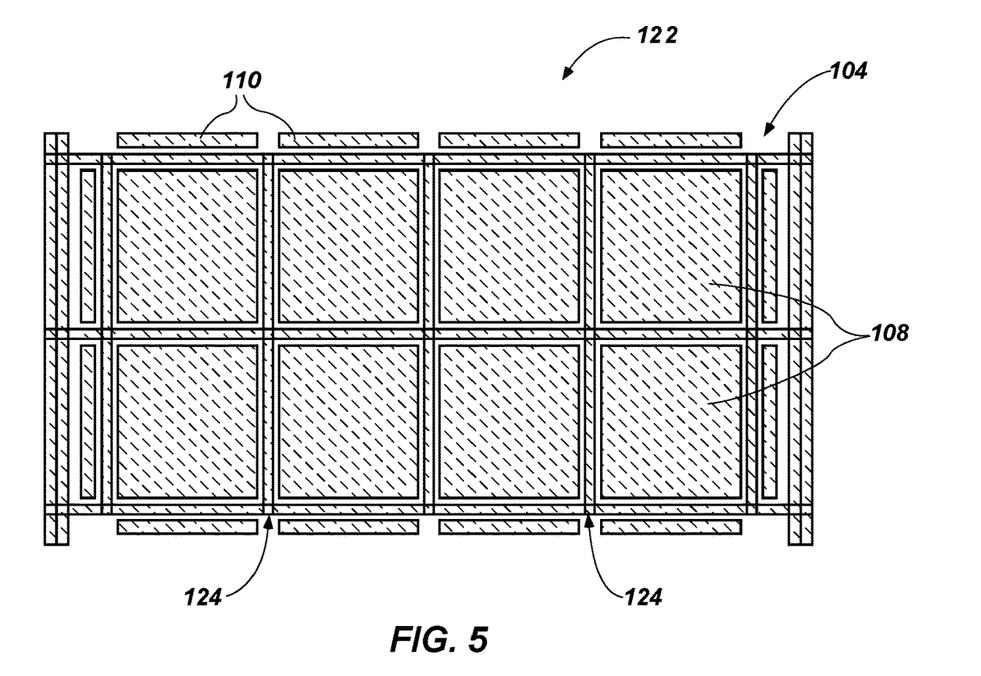
FIG. 5 is a top view of a second, different portion of the active surface of the semiconductor die of the semiconductor device package of FIG. 1.

FIG. 4 is a top view of a first portion 120 of the active surface 104 comprising resistors, and FIG. 5 is a top view of a second, different portion 122 of the active surface 104 comprising capacitors, of the semiconductor die 102 of the semiconductor device package 100 of FIG. 1. As shown in FIGS. 4 and 5, the regions 108 may be arranged in a repeating pattern of geometric shapes, such as, for example, a grid of rectangles as viewed perpendicular to the active surface 104. The metal material 110 may be located laterally between distinct regions 108 of the integrated circuitry, overlying streets 124 having no integrated circuitry therein/thereon or having embedded electrical connections to interconnect various ones of the regions 108. The metal material 110 may likewise form a repeating pattern of geometric shapes, for example rectangles, outlining the regions 108 of integrated circuitry.

Referring collectively to FIGS. 1 through 5, the semiconductor device package 100 may be formed by, for example, providing or forming the semiconductor die 102, including the regions 108 of integrated circuitry embedded within or formed on the active surface 104. The metal material 110 may be placed on the active surface 104 at least partially around distinct ones of the regions 108 of integrated circuitry. For example, a masking material 126 such as a photoresist may be placed on the active surface 104, and trenches or holes 128 (see FIG. 1) may be patterned in the masking material 126, such as, for example, by photolithography. The metal material 110 may then be placed (e.g., dispensed or deposited) in the trenches or holes 128 by conventional techniques (e.g., plating or sputtering) over the streets 124 on the active surface 104. This process of mask deposition, patterning, and metal material deposition may be repeated over several metallization levels and interposed via levels to increase the height of the metal material until the metal material 110 has reached the requisite maximum height $H_M$. The masking material 126 may be removed (e.g., using a solvent), or may remain in place over the active surface 104 and around the metal material 110.

At least a portion of the metal material 110 may be left electrically disconnected from the region 108 of integrated circuitry. For example, the positioning of the metal material 110 in the streets 124 may maintain the metal material 110, or a portion thereof, electrically insulated from contact with, and operative connection to, the integrated circuitry in the region 108. As another example, a dielectric material, such as, for example, the masking material 126 may be interposed between one or more portions of the metal material 110 and the integrated circuitry in the region 108. In some embodiments, at least another portion of the metal material 110 may be electrically connected to the integrated circuitry of the region 108, and may facilitate routing of electrical signals between various regions 108. Such a portion may be electrically isolated from the remainder of the metal material 110 to reduce the likelihood of making unintended electrical connections (i.e., shorts), such as, for example, by positioning one or more portions of a dielectric material (e.g., the masking material 126 or another dielectric material) between the electrically connected portions of the metal material 110 and the electrically isolated portions of the metal material 110.

The metal material 110 and semiconductor die 102 may be encapsulated in an encapsulant material 112 comprising a molding compound (e.g., a curable polymer material that is then cured), for example, by flowing the encapsulant material 112 over the metal material 110 and the semiconductor die 102 and curing the encapsulant material 112.

In other words, methods of making semiconductor device package in accordance with this disclosure may involve placing a metal material at least partially around at least one region of integrated circuitry on an active surface of a semiconductor die. At least a portion of the metal material may be left electrically disconnected from the at least one region of integrated circuitry. The semiconductor die and the metal material may be encapsulated in an encapsulant material, the encapsulant material extending to a height above the active surface higher than a maximum height of the metal material above the active surface.

Moreover, semiconductor devices, in accordance with this disclosure may include a semiconductor die comprising an active surface and at least one region of integrated circuitry on the active surface. A metal material may at least partially laterally surround the at least one region of integrated circuitry on the active surface, at least a portion of the metal material electrically disconnected from the at least one region of integrated circuitry.

Semiconductor device packages in accordance with this disclosure may include a semiconductor die comprising an active surface and a region of integrated circuitry on the active surface. A metal material may be located at least partially laterally surrounding the region of integrated circuitry on the active surface, at least a portion of the metal material electrically disconnected from the region of integrated circuitry. An encapsulant material may extend over the active surface and encapsulate at least an active surface portion of the semiconductor die and the metal material, the encapsulant material extending to a height above the active surface higher than a maximum height of the metal material above the active surface.

Figure 6:
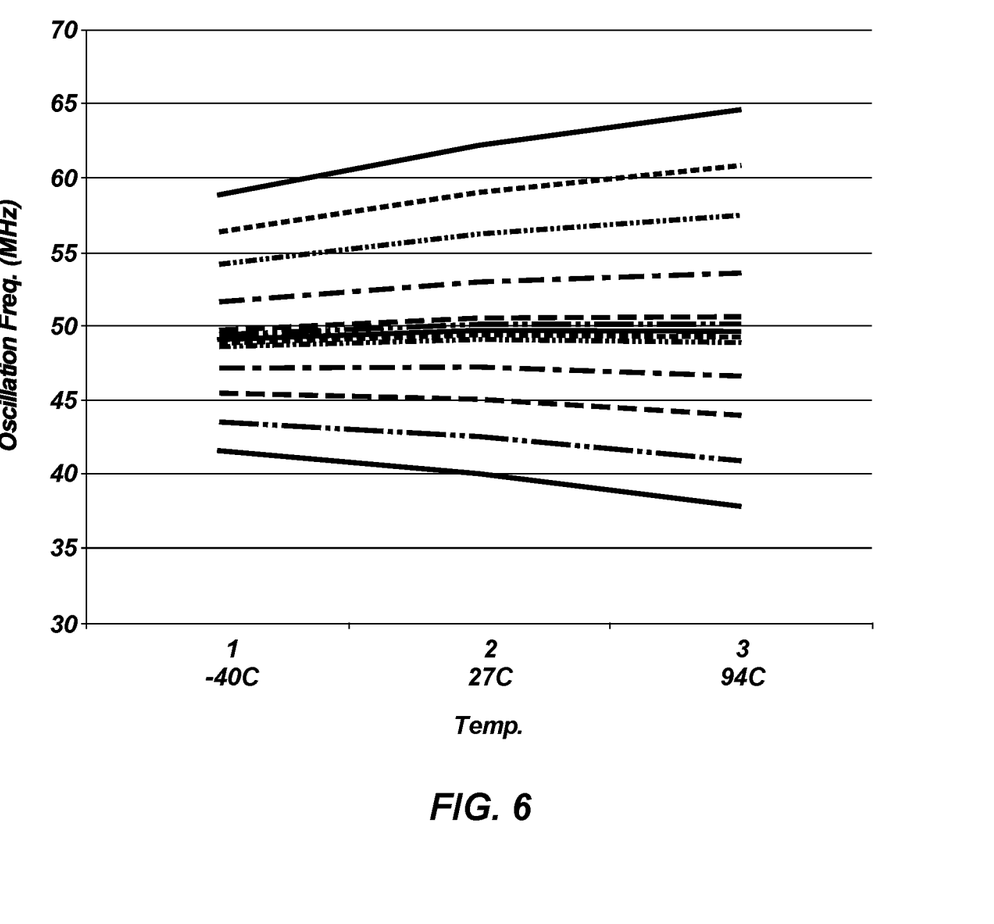
FIG. 6 is a graph of clock frequency of the relaxation oscillator relative to temperature for a variety of different trim codes.

FIG. 6 is a graph of clock frequency of an example relaxation oscillator in accordance with this disclosure relative to temperature for a variety of different trim codes. As shown in FIG. 6, the clock frequency of the relaxation oscillator may remain at least substantially constant at between about 45 MHz and about 50 MHz (e.g., about 48 MHz) at temperatures ranging from about −40° C. to about 94° C.

Figure 7:
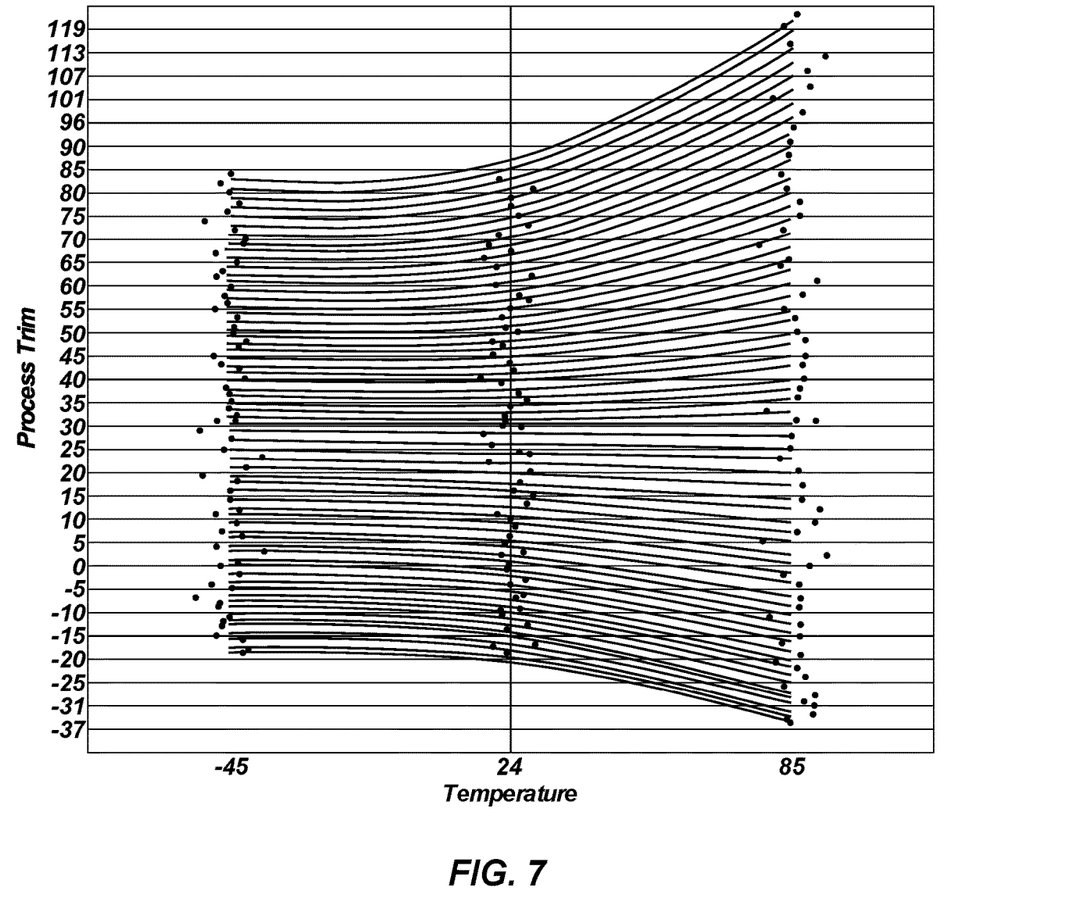
FIG. 7 is a graph of temperature trim code values required to produce consistent clock frequency in the relaxation oscillator relative to temperature.

FIG. 7 is a graph of temperature trim code values required to produce consistent clock frequency in the relaxation oscillator relative to temperature. As shown in FIG. 7, trim code values between about 30 and about 35 (e.g., about 32) may produce at least substantially constant frequency responses without requiring any change in the trim codes at temperatures ranging from about −40° C. to about 94° C.

Figure 8:
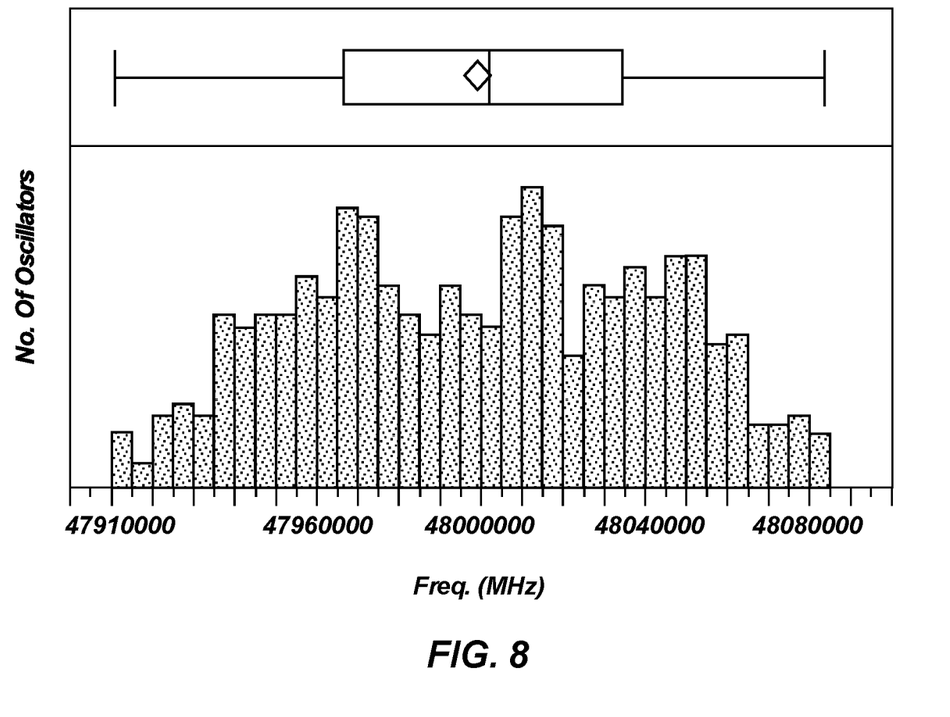
FIG. 8 is a graph of clock frequencies of several relaxation oscillators produced in accordance with this disclosure.

FIG. 8 is a graph of clock frequencies of several relaxation oscillators produced in accordance with this disclosure. Batches of relaxation oscillators in accordance with this disclosure, including the mechanical reinforcement and final packaging, were produced, and their clock frequencies were measured. As shown in FIG. 8, the actual frequencies of the relaxation oscillators remained within about 0.25% of the target frequency of about 48 MHz. More specifically, the actual frequency response was within 0.1% of the target frequency plus or minus one standard of deviation from the mean, and within 0.3% of the target frequency plus or minus three standards of deviation from the mean.

Relaxation oscillators produced in accordance with this disclosure may represent a significant advance in the cost efficiency of producing accurate clock frequencies. By replacing expensive crystal components with integrated circuitry and mechanical reinforcement, the cost of production may be reduced. The addition of mechanical reinforcement may also increase the precision with which final characteristics of the integrated circuitry may match the designed, target characteristics, producing more accurate performance results. Low-cost, high-accuracy relaxation oscillators in accordance with this disclosure may be usefully deployed in a wide variety of applications, such as, for example and without limitation, as the internal clocks in microcontroller units (MCUs), external clocks interfacing with MCUs, and communication adapters, such as an interface for a host bus to connect to nontransitory storage medium/memory. Such MCUs and associated adapters may be operable without requiring an external, crystal-based module for the clock signal (e.g., the clock reset signal). In some embodiments, the internal clock for the MCUs may be used to provide clock frequency for both internal and external functions, and an external, crystal-less clock may be used. As specific, nonlimiting examples, relaxation oscillators implemented with MCUs or as external modules for MCUs may be useful in hardware for implementing wired and wireless communication (e.g., in accordance with Universal Serial Bus (USB), BLUETOOTH®, ETHERNET®, FIREWIRE®, etc.) and R-DAC designs.

Figure 9:
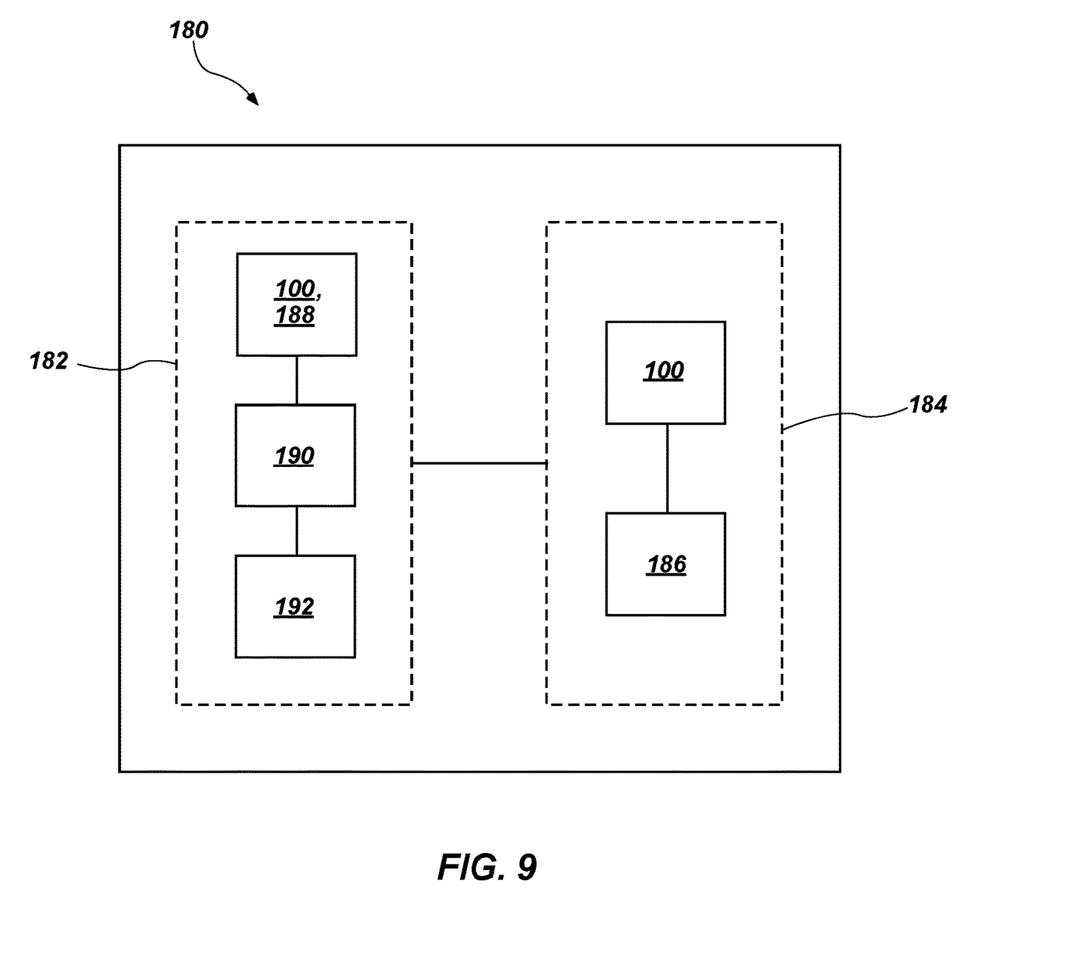
FIG. 9 is a schematic of a system including a semiconductor device in accordance with this disclosure.

For example, FIG. 9 is a schematic of a system 180 including one or more semiconductor device packages 100 in accordance with this disclosure. For example, the system 180 may include a control unit 182 and a probe unit 184. The probe unit 184 may be include a sensor device 186 configured to generate an electrical signal representative of, and in response to, a detected physical phenomenon. The probe unit 184 may be a portable device, such as, for example, a handheld device. In some embodiments, the probe unit 184 may include a semiconductor device package 100 in accordance with this disclosure located within the probe unit 184, the semiconductor device package 100 configured to at least partially process the electrical signal locally within the probe unit 184 (e.g., to regulate a frequency of a signal communication unit configured to transmit data signals from within the probe unit 184 in accordance with an electronic communications protocol). The probe unit 184 may be operatively connected to the control unit 182 (e.g., over a wired or wireless connection) and may send the raw, partially processed, or fully processed electrical signal to the control unit 182. In some embodiments, the control unit 182 may include another semiconductor device package 100 in accordance with this disclosure or a microprocessor 188, which may receive, decode, and/or further process the electrical signal. The control unit 182 may include a nontransitory memory device 190 configured to store the results of the fully processed electrical signal. The control unit 182 may optionally include an output device 192 (e.g., an electronic display, an audio speaker, a printer, etc.) configured to output the results of the fully processed electrical signal.

The semiconductor device package 100 itself, or one or more of the regions 108 of integrated circuitry, may be configured as a clock module. For example, the semiconductor device package 100, or one or more of the regions 108 of integrated circuitry, may be configured to provide the clock timing to synchronize one or more operations of the semiconductor device package 100, the system 180, another component of the system 180, or any combination of these. More specifically, the semiconductor device package 100 may comprise a MCU including a clock module having a relaxation oscillator lacking a crystal to synchronize one or more operations of the MCU, another component of the system 180 of which the MCU is a part, or the MCU and one or more other components of the system 180.

Additional, nonlimiting embodiments within the scope of this disclosure include the following:

Embodiment 1

A method of making a semiconductor device package, comprising: placing a metal material at least partially around at least one region of integrated circuitry on an active surface of a semiconductor die; leaving at least a portion of the metal material electrically disconnected from the at least one region of integrated circuitry; and encapsulating the semiconductor die and the metal material in an encapsulant material, the encapsulant material extending to a height above the active surface higher than a maximum height of the metal material above the active surface.

Embodiment 2

The method of Embodiment 1, wherein placing the metal material at least partially around the at least one region of integrated circuitry comprises placing the metal material entirely around the at least one region of integrated circuitry, such that the metal material laterally surrounds the at least one region of integrated circuitry.

Embodiment 3

The method of Embodiment 1 or Embodiment 2, wherein placing the metal material at least partially around the at least one region of integrated circuitry comprises building up the metal material to the maximum height, the maximum height being greater than or equal to a second-greatest maximum height of any other structure located above the active surface and encapsulated within the encapsulant material.

Embodiment 4

The method of Embodiment 3, wherein building up the metal material comprises sequentially placing a masking material above the active surface, patterning the masking material to form trenches or holes, and placing portions of the metal material in the trenches or holes.

Embodiment 5

The method of any one of Embodiments 1 through 4, further comprising electrically connecting at least another portion of the metal material to the at least one region of integrated circuitry, the at least another portion of the metal material being electrically disconnected from the at least a portion of the metal material.

Embodiment 6

The method of any one of Embodiments 1 through 5, wherein the at least one region comprises a plurality of regions, and further comprising placing the metal material at least partially around each of the plurality of regions of integrated circuitry on the active surface of the semiconductor die.

Embodiment 7

The method of any one of Embodiments 1 through 6, further comprising forming the integrated circuitry of the at least one region to comprise at least a portion of a relaxation oscillator.

Embodiment 8

The method of any one of Embodiments 1 through 7, wherein forming the integrated circuitry of the at least one region comprises forming a resistor or a capacitor.

Embodiment 9

The method of any one of Embodiments 1 through 8, wherein placing the metal material at least partially around the at least one region of integrated circuitry on the active surface of the semiconductor die comprises forming one of a wall, a fence, or a cage of the metal material at least partially around the at least one region.

Embodiment 10

A semiconductor device, comprising: a semiconductor die comprising an active surface; at least one region of integrated circuitry on the active surface; and a metal material at least partially laterally surrounding the at least one region of integrated circuitry on the active surface, at least a portion of the metal material electrically disconnected from the at least one region of integrated circuitry.

Embodiment 11

The semiconductor device of Embodiment 10, wherein the at least one region of integrated circuitry comprises at least a portion of a relaxation oscillator.

Embodiment 12

The semiconductor device of Embodiment 11, wherein the at least one region of integrated circuitry comprises a resistor or a capacitor.

Embodiment 13

The semiconductor device of Embodiment 11 or Embodiment 12, wherein the metal material is configured to mechanically reinforce the region of integrated circuitry to cause an actual frequency of the relaxation oscillator to remain within about 0.25% of a target frequency when the semiconductor device is exposed to environmental temperatures ranging from about −40° C. to about 94° C.

Embodiment 14

The semiconductor device of any one of Embodiments 10 through 13, wherein the metal material substantially entirely laterally surrounds the at least one region of integrated circuitry.

Embodiment 15

The semiconductor device of any one of Embodiments 10 through 13, wherein the at least one region comprises a plurality of regions and the metal material at least partially surrounds each of the plurality of regions of integrated circuitry, the metal material forming a grid when viewed perpendicular to the active surface.

Embodiment 16

The semiconductor device of any one of Embodiments 10 through 15, wherein at least another portion of the metal material is electrically connected to the at least one region of integrated circuitry, the at least another portion of the metal material being electrically disconnected from the at least a portion of the metal material.

Embodiment 17

The semiconductor device of any one of Embodiments 10 through 16, wherein the metal material at least partially surrounding the at least one region of integrated circuitry comprises one of a wall, a fence, or a cage of the metal material extending at least partially around the at least one region.

Embodiment 18

A semiconductor device package, comprising: a semiconductor die comprising an active surface; a region of integrated circuitry on the active surface; a metal material located at least partially laterally surrounding the region of integrated circuitry on the active surface, at least a portion of the metal material electrically disconnected from the region of integrated circuitry; and an encapsulant material extending over the active surface and encapsulating at least an active surface portion of the semiconductor die and the metal material, the encapsulant material extending to a height above the active surface higher than a maximum height of the metal material above the active surface.

Embodiment 19

The semiconductor device package of Embodiment 18, wherein the region of integrated circuitry comprises at least a portion of a relaxation oscillator.

Embodiment 20

The semiconductor device package of Embodiment 19, wherein the portion of the relaxation oscillator comprises a resistor or a capacitor.

Embodiment 21

The semiconductor device package of Embodiment 19 or Embodiment 20, wherein the metal material is configured to mechanically reinforce the at least one region of integrated circuitry responsive at least to temperature change-induced stress, to maintain an actual frequency of the relaxation oscillator after packaging within about 0.25% of a target frequency when the semiconductor device is exposed to environmental temperatures ranging from about −40° C. to about 94° C.

Embodiment 22

The semiconductor device package of any one of Embodiments 18 through 21, wherein the maximum height is greater than or equal to a second-greatest maximum height of any other structure located above the active surface and encapsulated within the encapsulant material.

Embodiment 23

The semiconductor device package of any one of Embodiments 18 through 22, wherein the metal material entirely laterally surrounds the region of integrated circuitry.

Embodiment 24

The semiconductor device package of any one of Embodiments 18 through 23, wherein at least one region comprises a plurality of regions and the metal material at least partially surrounds each of the plurality of regions of integrated circuitry on the active surface, the metal material forming a grid when viewed perpendicular to the active surface.

Embodiment 25

The semiconductor device package of any one of Embodiments 18 through 24, wherein the metal material at least partially surrounding the at least one region of integrated circuitry comprises one of a wall, a fence or a cage of the metal material extending at least partially around the at least one region.

Embodiment 26

A microcontroller unit, comprising: a semiconductor device or a semiconductor device package according to any of Embodiments 10 through 25.

Embodiment 27

The microcontroller unit of Embodiment 26, wherein the semiconductor device or semiconductor device package is configured as a clock module for the microcontroller unit.

Embodiment 28

A wired or wireless communication module, comprising: a microcontroller unit comprising a semiconductor device or a semiconductor device package according to any of Embodiments 10 through 25.

Embodiment 29

The wired or wireless communication module of Embodiment 28, wherein the semiconductor device or semiconductor device package is configured as a clock module for the microcontroller unit.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A method of making a semiconductor device package, comprising:
    placing a metal material entirely around each region of a plurality of regions of integrated circuitry on an active surface of a semiconductor die;
    leaving at least a portion of the metal material electrically disconnected from each region of integrated circuitry; and
    encapsulating the semiconductor die and the metal material in an encapsulant material, the encapsulant material extending to a height above the active surface higher than a maximum height of the metal material above the active surface.

2. The method of claim 1, wherein placing the metal material entirely around each region of the plurality of regions of integrated circuitry, comprises: building up the metal material to the maximum height, the maximum height being greater than or equal to a second-greatest maximum height of any other structure located above the active surface, and encapsulated within the encapsulant material.

3. The method of claim 2, wherein building up the metal material comprises sequentially placing a masking material above the active surface, patterning the masking material to form trenches or holes, and placing portions of the metal material in the trenches or holes.

4. The method of claim 1, further comprising electrically connecting at least another portion of the metal material to at least one region of the plurality of regions of integrated circuitry, the at least another portion of the metal material being electrically disconnected from the at least a portion of the metal material.

5. The method of claim 1, further comprising forming the integrated circuitry of the plurality of regions to comprise at least a portion of a relaxation oscillator.

6. The method of claim 1, wherein forming the integrated circuitry of the plurality of regions comprises forming a resistor or a capacitor in at least one region of the plurality of regions.

7. The method of claim 1, wherein placing the metal material entirely around each region of the plurality of regions of integrated circuitry on the active surface of the semiconductor die comprises forming one of a wall, a fence, or a cage of the metal material entirely around each region.

8. A semiconductor device, comprising:
    a semiconductor die comprising an active surface;
    a plurality of regions of integrated circuitry on the active surface; and
    a metal material entirely laterally surrounding each region of the plurality of regions of integrated circuitry on the active surface, at least a portion of the metal material electrically disconnected from each region of integrated circuitry.

9. The semiconductor device of claim 8, wherein the plurality of regions of integrated circuitry comprises at least a portion of a relaxation oscillator.

10. The semiconductor device of claim 9, wherein at least one region of the plurality of regions of integrated circuitry comprises a resistor or a capacitor.

11. The semiconductor device of claim 9, wherein the metal material is configured to mechanically reinforce the region of integrated circuitry to cause an actual frequency of the relaxation oscillator to remain within about 0.25% of a target frequency when the semiconductor device is exposed to environmental temperatures ranging from about −40° C. to about 94° C.

12. The semiconductor device of claim 8, wherein the metal material forms a grid when viewed perpendicular to the active surface.

13. The semiconductor device of claim 8, wherein at least another portion of the metal material is electrically connected to at least one region of the plurality of regions of integrated circuitry, the at least another portion of the metal material being electrically disconnected from the at least a portion of the metal material.

14. The semiconductor device of claim 8, wherein the metal material entirely surrounding each region of the plurality of regions of integrated circuitry comprises one of a wall, a fence, or a cage of the metal material extending entirely around each region.

15. A semiconductor device package, comprising:
    the semiconductor device of claim 8; and
    an encapsulant material extending over the active surface and encapsulating at least the active surface of the semiconductor die and the metal material, the encapsulant material extending to a height above the active surface higher than a maximum height of the metal material above the active surface.

16. The semiconductor device package of claim 15, wherein the plurality of regions of integrated circuitry comprises at least a portion of a relaxation oscillator.

17. The semiconductor device package of claim 16, wherein the portion of the relaxation oscillator comprises a resistor or a capacitor.

18. The semiconductor device package of claim 16, wherein the metal material is configured to mechanically reinforce the at least one region of integrated circuitry responsive at least to temperature change-induced stress, to maintain an actual frequency of the relaxation oscillator after packaging within about 0.25% of a target frequency when the semiconductor device is exposed to environmental temperatures ranging from about −40° C. to about 94° C.

19. The semiconductor device package of claim 16, wherein the maximum height is greater than or equal to a second-greatest maximum height of any other structure located above the active surface and encapsulated within the encapsulant material.

20. The semiconductor device package of claim 16, wherein at least one region comprises a plurality of regions and the metal material at least partially surrounds each of the plurality of regions of integrated circuitry on the active surface, the metal material forming a grid when viewed perpendicular to the active surface.

21. The semiconductor device package of claim 16, wherein the metal material at least partially surrounding the at least one region of integrated circuitry comprises one of a wall, a fence or a cage of the metal material extending at least partially around the at least one region.

22. A clock module, comprising:
    a semiconductor device of claim 8,
        wherein one or more regions of the plurality of regions of integrated circuitry is operatively configured as a relaxation oscillator configured to provide synchronization timing for the clock module; and an encapsulant material extending over the active surface and encapsulating at least an active surface portion of the semiconductor die and the metal material, the encapsulant material extending to a height above the active surface higher than a maximum height of the metal material above the active surface.

23. A microcontroller unit, comprising:

a semiconductor device of claim 8, wherein one or more regions of the plurality of regions of the integrated circuitry is operatively configured as a relaxation oscillator configured to provide synchronization timing for the microcontroller unit, and an encapsulant material extending over the active surface and encapsulating at least an active surface portion of the semiconductor die and the metal material, the encapsulant material extending to a height above the active surface higher than a maximum height of the metal material above the active surface.

* * * * *

UNITED STATES PATENT AND TRADEMARK OFFICE
CERTIFICATE OF CORRECTION

| | |
|---|---|
| PATENT NO. | : 10,734,298 B2 |
| APPLICATION NO. | : 16/121313 |
| DATED | : August 4, 2020 |
| INVENTOR(S) | : Hyunsoo Yeom, Ajay Kumar and John House |

It is certified that error appears in the above-identified patent and that said Letters Patent is hereby corrected as shown below:

In the Claims

| | | | |
|---|---|---|---|
| Claim 2, | Column 11, | Lines 31, 32, | change "active surface, and" to --active surface; and-- |
| Claim 23, | Column 13, | Line 14, | change "microcontroller unit, and" to --microcontroller unit; and-- |

Signed and Sealed this
Tenth Day of November, 2020

Andrei Iancu
*Director of the United States Patent and Trademark Office*